(12) United States Patent
Beiro et al.

(10) Patent No.: US 11,952,119 B2
(45) Date of Patent: Apr. 9, 2024

(54) PAYLOAD SUPPORT FRAME FOR UNMANNED AERIAL SYSTEM

(71) Applicant: BEIROBOTICS LLC, Richmond, VA (US)

(72) Inventors: Michael Kenneth Beiro, Richmond, VA (US); Alvin Leroy Corbin, III, Dillwyn, VA (US); Chase Hamilton Coble, North Chesterfield, VA (US); David Carson Schul, Richmond, VA (US)

( * ) Notice: Subject to any disclaimer, the term of this patent is extended or adjusted under 35 U.S.C. 154(b) by 16 days.

(21) Appl. No.: 17/735,111

(22) Filed: May 2, 2022

(65) Prior Publication Data
US 2022/0355930 A1 Nov. 10, 2022

Related U.S. Application Data

(60) Provisional application No. 63/184,668, filed on May 5, 2021.

(51) Int. Cl.
*B64D 1/22* (2006.01)
*B64C 39/02* (2023.01)
(Continued)

(52) U.S. Cl.
CPC .............. *B64D 1/22* (2013.01); *B64C 39/024* (2013.01); *G01R 31/085* (2013.01); *H02G 1/02* (2013.01);
(Continued)

(58) Field of Classification Search
CPC .... B64C 39/024; G01R 31/085; B64U 10/13; B64U 2101/00; H02G 1/02
See application file for complete search history.

(56) References Cited

U.S. PATENT DOCUMENTS 4,378,919 A * 4/1983 Smith .................... B64D 1/22
294/81.4
10,613,429 B1 * 4/2020 Wingo .................. G01N 23/00
(Continued)

FOREIGN PATENT DOCUMENTS

FR 2656730 A1 7/1991
FR 3055419 A1 3/2018
(Continued)

OTHER PUBLICATIONS

International Search Report and Written Opinion for PCT Appl. No. PCT/US2020/026709, dated Jun. 23, 2020, 9 pages.
(Continued)

*Primary Examiner* — Christopher P McAndrew
*Assistant Examiner* — Zannatul Ferdous
(74) *Attorney, Agent, or Firm* — Thompson Hine LLP

(57) ABSTRACT

A payload support frame is adapted to suspend a payload from an unmanned aerial vehicle (UAV) during flight. The frame comprises at least one elongated rigid segment, at least one upper flexible segment at an upper end of the rigid segment, and at least one lower flexible segment at a lower end of the rigid segment. One or more of (a) the at least one rigid segment, (b) the at least one upper flexible segment, or (c) the at least one lower flexible segment comprise a dielectric material. The upper flexible segment is adapted to be selectively attachable, directly or indirectly, to the UAV. The lower flexible segment is adapted to be selectively attachable, directly or indirectly, to the payload.

12 Claims, 10 Drawing Sheets

(51) Int. Cl.
  *B64U 10/13*    (2023.01)
  *B64U 101/00*   (2023.01)
  *B64U 101/60*   (2023.01)
  *G01R 31/08*    (2020.01)
  *H02G 1/02*     (2006.01)

(52) U.S. Cl.
  CPC .......... *B64U 10/13* (2023.01); *B64U 2101/00* (2023.01); *B64U 2101/60* (2023.01)

(56) References Cited

U.S. PATENT DOCUMENTS

| | | | |
|---|---|---|---|
| 2016/0023761 A1* | 1/2016 | McNally | B64C 39/024 701/3 |
| 2016/0376031 A1* | 12/2016 | Michalski | G08G 5/025 701/15 |
| 2017/0029104 A1 | 2/2017 | Kim | |
| 2017/0240277 A1 | 8/2017 | Molnar et al. | |
| 2017/0291704 A1* | 10/2017 | Alegria | B64D 47/08 |
| 2017/0316701 A1 | 11/2017 | Gil et al. | |
| 2020/0317336 A1 | 10/2020 | Beiro et al. | |
| 2022/0340253 A1* | 10/2022 | Lacko | B29C 70/70 |

FOREIGN PATENT DOCUMENTS

| | | |
|---|---|---|
| KR | 200440322 Y1 | 6/2008 |
| WO | 2018094514 A1 | 5/2018 |

OTHER PUBLICATIONS

Matrice 600PRO from DJI, available at https://www.dji.com/matrice600-pro, last accessed Feb. 27, 2020, 4 pages.
Ohmstik Plus from SensorLink, available at https://sensorlink.com/products/ohmstik, last accessed Feb. 27, 2020, 9 pages.
Payload Drop System for DJI Matrice 600/Pro from Rise Above Custom Drones & Robotics, last accessed Feb. 27, 2020, 6 pages.
Snap-Together Cable and Hose Carrier from McMaster—Carr, available at https://www.mcmaster.com/4516147, last accessed Feb. 27, 2020, 1 page.
Drone X-Ray Power Line Inspections—Better, Faster, Safer, Talon Aerolytics, Inc., Aug. 29, 2017, available at https://www.talon.io/talon-launches-x-ray-technology-aimed-electric-power-industries/, last accessed Mar. 29, 2020, 4 pages.
U.S. Patent and Trademark Office, International Search Report and Written Opinion of the International Searching Authority, International Application No. PCT/US2022/027481, 13 pages, dated Oct. 5, 2022.

* cited by examiner

PAYLOAD SUPPORT FRAME FOR UNMANNED AERIAL SYSTEM

CROSS-REFERENCE TO RELATED APPLICATIONS

This application claims priority to Ser. No. 63/184,668, filed May 5, 2021, the contents of which are incorporated herein by reference in its entirety. This application is also related to U.S. Provisional Application Ser. No. 62/830,371, filed Apr. 6, 2019, Ser. No. 62/934,487, filed Nov. 12, 2019, U.S. Provisional Application Ser. No. 62/978,446, filed Feb. 19, 2020, and pending U.S. patent application Ser. No. 16/838,745, filed Apr. 2, 2020, the contents of which are incorporated herein by reference in their entirety.

FIELD OF THE INVENTION

This invention relates generally to electric power lines and more particularly to systems and methods for monitoring components of same.

BACKGROUND OF THE DISCLOSURE

It is sometimes necessary to inspect or monitor the components of electric power lines, or to make repairs or otherwise perform work on such power lines. For some power lines these components are often located high above the ground, making them difficult to access to perform any needed inspection or repair.

BRIEF SUMMARY OF THE DISCLOSURE

In one embodiment of the invention, a payload support frame adapted to suspend a payload from an unmanned aerial vehicle (UAV) during flight comprises at least one elongated rigid segment, at least one upper flexible segment at an upper end of the rigid segment, and at least one lower flexible segment at a lower end of the rigid segment. One or more of (a) the at least one rigid segment, (b) the at least one upper flexible segment, or (c) the at least one lower flexible segment comprise a dielectric material. The at least one upper flexible segment is adapted to be selectively attachable, directly or indirectly, to the UAV. The at least one lower flexible segment is adapted to be selectively attachable, directly or indirectly, to the payload.

The at least one rigid segment may comprise at least three rigid segments. The at least one upper flexible segment may comprise at least three upper flexible segments, each at an upper end of a corresponding rigid segment. The at least one lower flexible segment may comprise at least three lower flexible segments, each at a lower end of a corresponding rigid segment.

Each of the at least three rigid segments may comprise an elongated pole. Each of the at least three upper flexible segments may comprise a rope, cable, or wire. Each of the at least three lower flexible segments may comprise a rope, cable, or wire. Each of the elongated poles may be hollow. Each of the at least three upper flexible segments and corresponding ones of each of the at least three lower flexible segments each may comprise a single rope, cable, or wire extending through a corresponding one of the elongated poles. The elongated poles each may comprise two or more telescoping pole segments.

The frame may further comprise a rigid upper spacer frame configured to hold the at least three upper flexible segments, and thereby the upper ends of the corresponding rigid segments, in a spaced-apart arrangement. The frame may further comprise a rigid lower spacer frame configured to hold the at least three lower flexible segments, and thereby the lower ends of the corresponding rigid segments, in a spaced-apart arrangement.

The at least three upper flexible segments may comprise at least three first upper flexible segments. The at least three lower flexible segments may comprise at least three first lower flexible segments. The frame may further comprise at least three second upper flexible segments and at least three second lower flexible segments. Each of the at least three second upper flexible segments may be on an opposite side of the upper spacer frame from a corresponding one of the at least three first upper flexible segments. Each of the at least three second lower flexible segments may be on an opposite side of the lower spacer frame from a corresponding one of the at least three first lower flexible segments. Each of the at least three second upper flexible segments and a corresponding one of the at least three first upper flexible segments may comprise a single rope, cable, or wire extending through a corresponding channel in the rigid upper spacer frame. Each of the at least three second lower flexible segments and a corresponding one of the at least three first lower flexible segments may comprise a single rope, cable, or wire extending through a corresponding channel in the rigid lower spacer frame.

BRIEF DESCRIPTION OF THE SEVERAL VIEWS OF THE DRAWINGS

Reference will now be made to the accompanying drawings, which are not necessarily drawn to scale. The following detailed description of the disclosure will be better understood when read in conjunction with the appended drawings. It should be understood, however, that the disclosure is not limited to the precise arrangements and instrumentalities shown. In the drawings.

DETAILED DESCRIPTION OF THE DISCLOSURE

Figure 1:
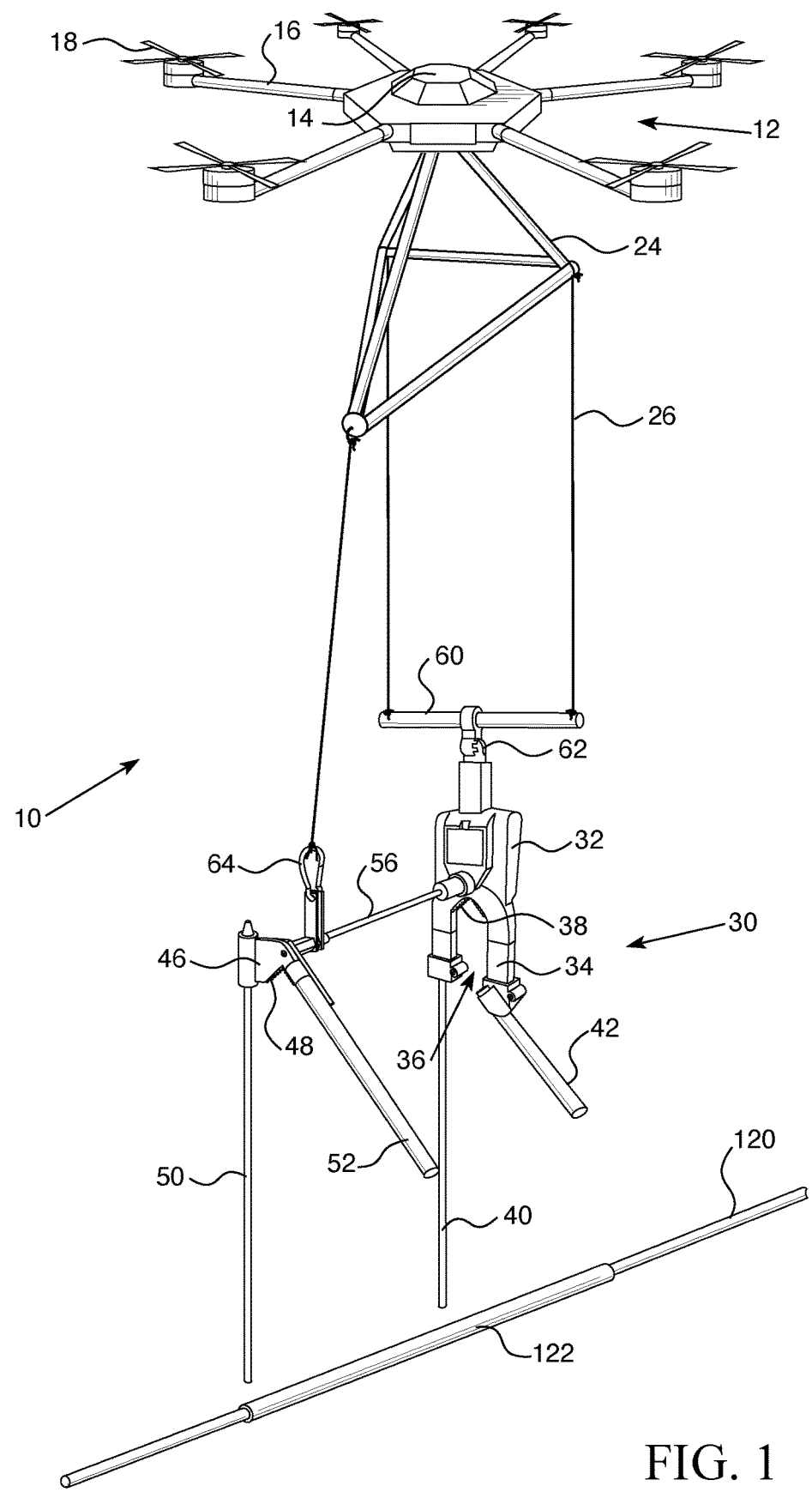
FIG. 1 is a perspective view of a system for contact inspection of electrical power lines, on approach to a power line, in accordance with embodiments of the invention.
Figure 2:
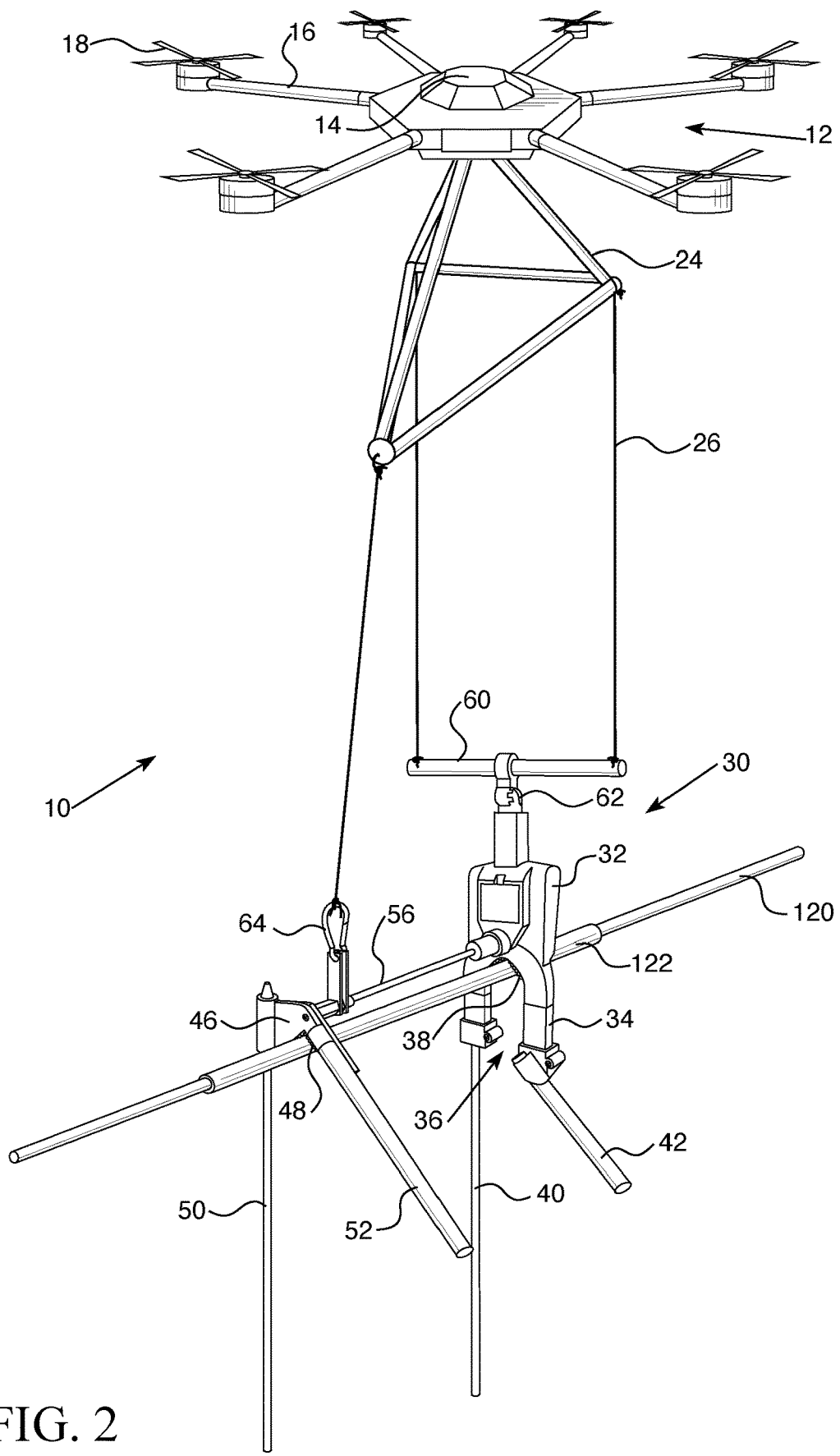
FIG. 2 is a perspective view of the system of FIG. 1, in contact with the power line.

Certain terminology is used in the following description for convenience only and is not limiting. The words "lower,"

"bottom," "upper," and "top" designate directions in the drawings to which reference is made. The words "inwardly," "outwardly," "upwardly" and "downwardly" refer to directions toward and away from, respectively, the geometric center of the device, and designated parts thereof, in accordance with the present disclosure. Unless specifically set forth herein, the terms "a," "an" and "the" are not limited to one element, but instead should be read as meaning "at least one." The terminology includes the words noted above, derivatives thereof and words of similar import.

In the world of power line inspection, one of the most critical components of a conductor line is the sleeve, which joins two lengths of cable and can repair over existing cracks and breaks in the line. These sleeves, called "splices," have often been installed incorrectly in previous decades due to poor oversight of third-party contractors performing maintenance operations and as a result can fail to the point that they break apart in some instances, causing serious problems on the power grid. Currently inspection of these components is done via infrared thermography and contact resistance measurement. Infrared provides more quantitative data about where a problem exists, while resistance provides more qualitative information about an anomaly once it has been isolated. Resistance is a much less convenient and more dangerous method as it conventionally requires manned crews in telescoping or flying vehicles to make contact with high voltage lines.

As they are a common failure point, maintaining and diagnosing splices of breaks between lines comprises a large portion of the work done to maintain grid health. Currently unmanned aerial surveillance (UAS) technology allows for easy visual and infrared inspection of lines, but checking splice resistance and health requires either a bucket truck or a helicopter and bringing a lineman close to high voltage lines to physically make contact with the splice. This work can be extremely expensive and dangerous.

Embodiments of the present invention provide a solution for energy companies for taking resistance measurements of high voltage lines using unmanned aerial vehicles (UAVs, often called drones), greatly reducing the manpower, cost, liability, and time to check splices. The methodology can be further expanded to enable other contact live-line work conducted through unmanned systems. Embodiments of the invention can drastically change the way power lines are inspected and maintained.

Embodiments of the invention provide a much safer and more cost-effective solution. As described herein, embodiments of the present invention encompass systems and method for outfitting a UAV with the tools required to take measurements of splices remotely while a technician watches and controls the craft from the ground. Such systems and methods can trivialize the liability, labor, and monetary costs associated with splice inspection, and allow for more efficient and thorough checking of the electrical grid to better foresee and prevent failures. In some exemplary embodiments of the invention, a commercially available drone is outfitted with a Radio OhmStik or equivalently functioning tool to take resistance measurements on live conductor wire. Given the prevalence, affordability, and variety of drones on the market, this can yield an inexpensive solution for a costly problem, and while the immediate savings in maintenance costs will be valuable, the increase in grid reliability will yield exponentially greater dividends. While a typical inspection run can require as many as three workers and over thirty minutes for one mission, a drone would allow one inspector and one supervisor to deploy, position, record, and leave the site in just fifteen minutes.

Embodiments of the invention are directed to systems and methods for using a UAV to deliver and land a tool or similar device on an electrical power line and/or on a splice on an electrical power line, while the UAV maintains flight and does not itself land on the power line and/or splice. Such a tool may include a contact inspection tool, such as an OhmStik' from SensorLink Corporation that reads microOhm resistances on high-voltage connections. Other suitable inspection tools may be used by embodiments of the invention. Other suitable tools for repairing or otherwise performing work on an electrical power line and/or on a splice may be used by embodiments of the invention. Such tools are collectively referred to herein as "power line tools."

The term "power line" as used herein is intended to include any line, wire, cable, etc. in a power grid through which electricity flows, regardless of the voltage carried by the line and whether such a line, wire, cable, etc. might be conventionally considered part of a transmission system, distribution system, or any other portion of a power grid. In this regard, embodiments of the invention may be used to perform work on any elevated electricity-carrying line, wire, cable, etc.

Importantly and notably, embodiments of the invention are adapted to perform work on energized power lines, that is, power lines that are conducting electricity while the work is being performed. There is no need to shut down the power lines to perform work using embodiments of the invention. Not having to shut down the power lines is a significant benefit in that shutting down a power line, especially a high-voltage power line, is time-consuming and costly.

Referring now to the figures, a system 10 for performing work (including contact inspection, repair, or any other suitable work tasks that may be performed) on an electrical power line 120 and/or a splice 122 on the electrical power line 120 is illustrated in accordance with an exemplary embodiment of the invention. The system 10 comprises an unmanned aerial vehicle (UAV) 12, a power line tool 30 adapted to perch on the power line 120 and/or the splice 122, a support frame 24 selectively releasably attached to the UAV 12, and a plurality of flexible dielectric support lines 26 (three are shown, although more or fewer may be used; however fewer cables may not provide stable support for the tool 30 during flight) attaching the power line tool 30 to the support frame 24. Each of the support lines 26 is attached to a corresponding attachment point on the support frame 24 and a corresponding attachment point on the power line tool 30.

The UAV may be any suitable remotely piloted aircraft, typically multi-rotor, with sufficient payload capacity to carry the support frame, support lines, and power line tool. In the illustrated embodiment, UAV 12 comprises a main body 14 and six rotors 18 supported by corresponding rotor support arms 16 (any suitable number of rotors may be used). In one exemplary embodiment of the invention, the UAV comprises a Matrice 600 Pro Hexacopter from DJI. As is conventionally known, the UAV 12 is controlled in flight by an operator or pilot using a controller (not illustrated). The UAV will typically have retractable landing gear (not illustrated)

In the illustrated embodiment, the support frame 24 is generally pyramidal, providing two front attachment points and one rear attachment point for the support lines 26. However, any suitable support frame structure may be used. Having at least three attachment points provides more stability to the tool during flight than having only one or two attachment points. The number, position, and arrangement of the attachment points may vary. The support lines may be attached to the support frame in any suitable manner or with any suitable mechanism, and may be removably attached or fixedly attached. The support frame may be constructed from any suitable material or combination of materials that is sufficiently strong, sufficiently rigid, and sufficiently lightweight, such as carbon fiber or any suitable polymer.

Figure 3:
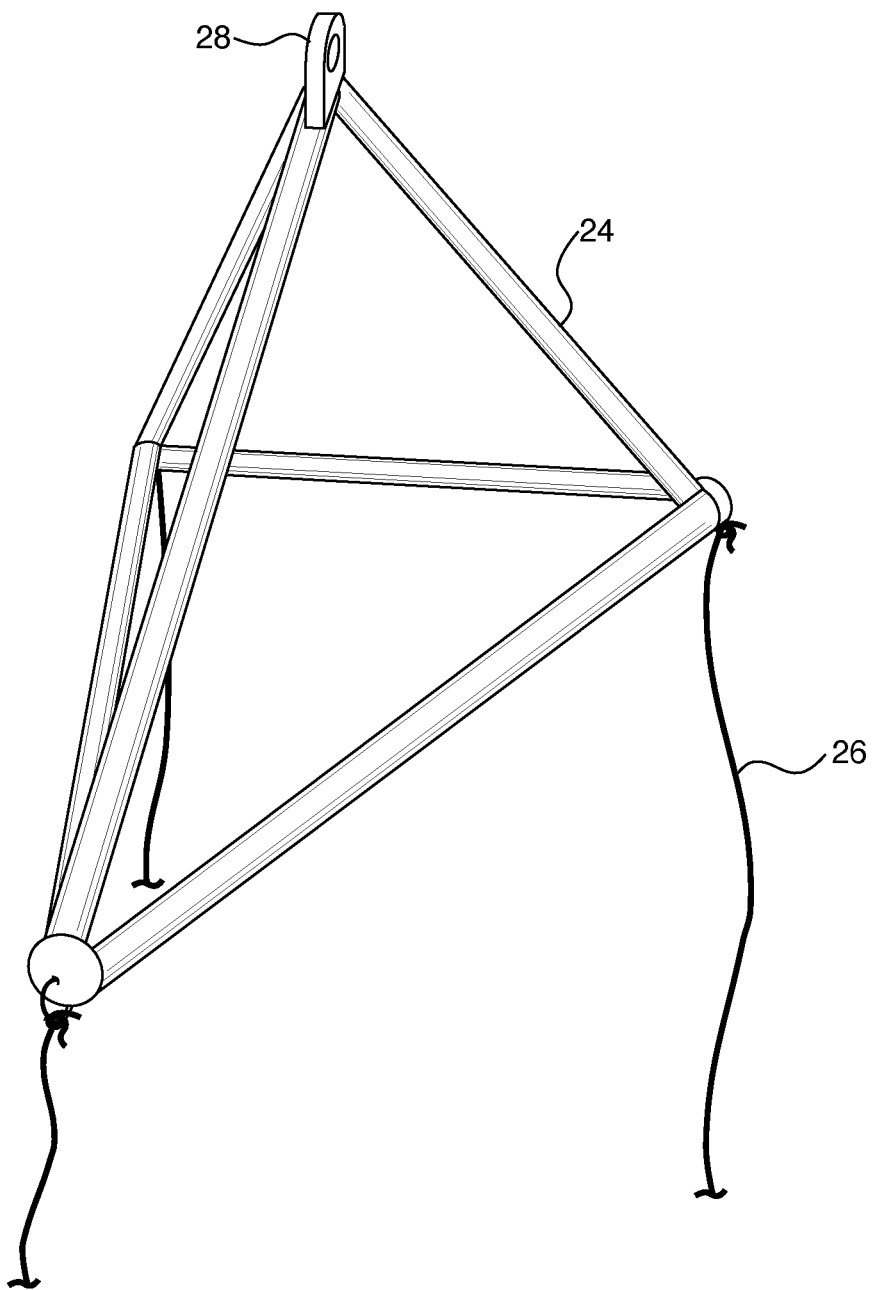
FIG. 3 is a perspective view of a support frame of the system of FIG. 1.
Figure 4:
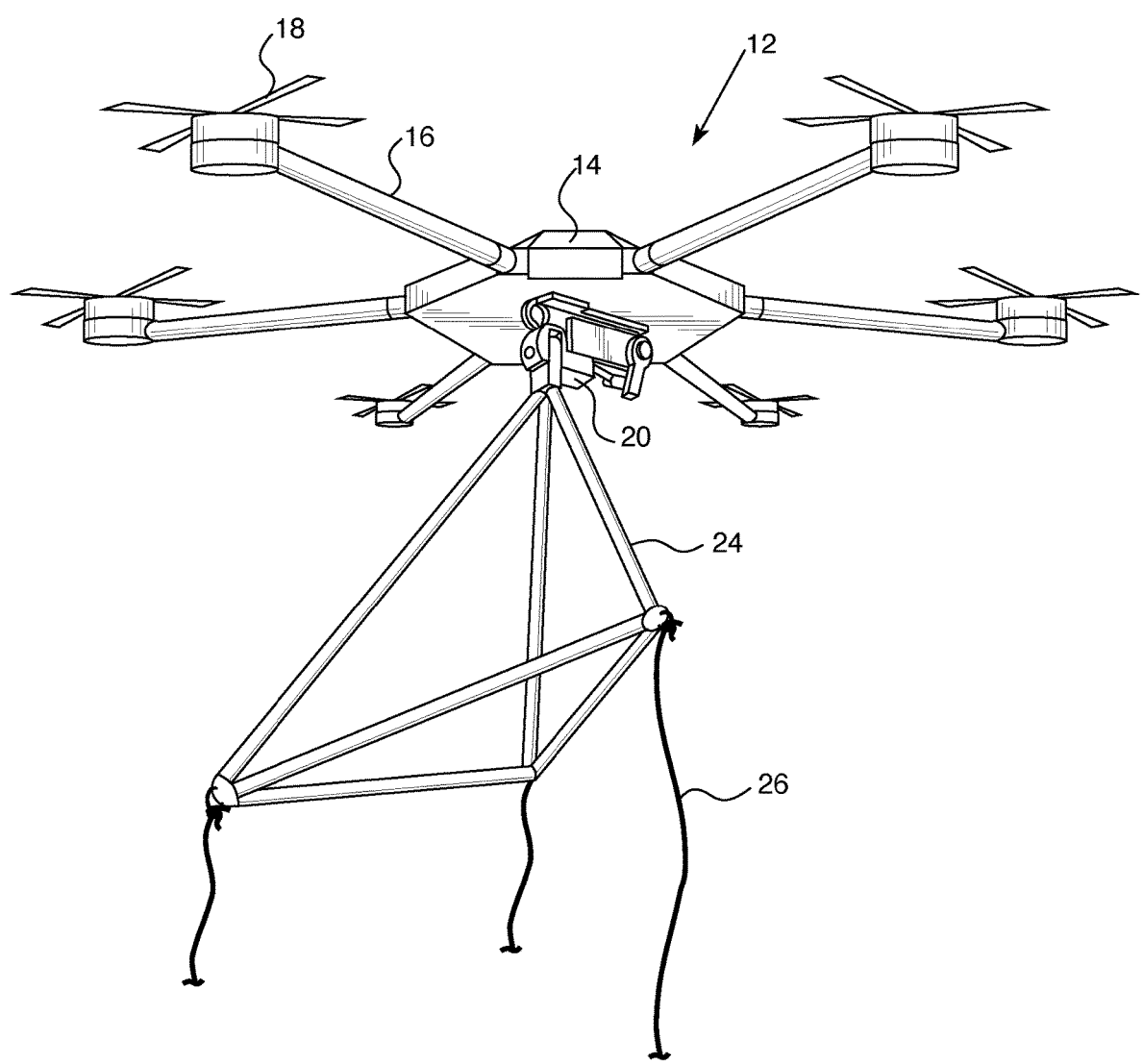
FIG. 4 is a bottom perspective view of a portion of the system of FIG. 1.

As seen in FIG. 3, the support frame 24 has a UAV attachment flange 28. The UAV attachment flange 28 is generally aligned with the central front-to-back axis of the support frame. The UAV attachment flange 28 mates with a payload release mechanism 20 (shown in FIG. 4) that is mounted to the underside of the main body 14 of the UAV 12 to enable releasable attachment of the support frame 24 to the UAV 12. In one exemplary embodiment of the invention, the payload release mechanism 20 comprises the Payload Drop System: Heavy Duty from Rise Above Custom Drones & Robotics, but any suitable payload release mechanism may be used. The payload release mechanism 20 has a movable pin that selectively engages with the hole in the UAV attachment flange 28. The pin engages with the hole in the UAV attachment flange 28 to couple the support frame 24 and the UAV 12 during normal operation of the system and disengages to release the support frame 24 from the UAV 12 at the end of a mission (described further below) or in an emergency (described further below). The thickness of the UAV attachment flange 28 is selected to enable the support frame 24 to pitch relative to the UAV but to somewhat limit yaw and roll of the support frame 24 relative to the UAV as the UAV 12 pitches, yaws, and rolls during flight (some yaw and roll of the support frame is acceptable to limit yaw and roll of the support frame from transferring to the UAV). The payload release mechanism 20 is controlled by the UAV operator.

The support lines may comprise any suitably strong and flexible material, such as ropes (natural or synthetic), metallic cables, wires, etc. In one exemplary embodiment of the invention, the support lines comprise Hy-Dee-Brait Hot Rope from Yale Cordage. The material selected for the support lines is typically a non-conductive (dielectric) material to prevent electricity from being conducted up the support lines to the UAV. Although it may be possible to electrically shield the critical components of the UAV, it is typically desirable that the length of the support lines 26 be long enough to maintain a sufficient distance between the UAV and the power line to prevent damage to the UAV from the electromagnetic fields surrounding such high-voltage power lines. In this regard, the length of the support lines 26 may be selected based on the voltage of the power line upon which the tool 30 is to be perched (based on the live-line work approach distances set forth in the National Electrical Safety Code). For example, if the voltage of the power line is 145 kilovolts (kV), then the length of the support lines 26 should be at least five feet, four inches to maintain the desired spacing between the UAV and the power line. As another example, if the voltage of the power line is 362 kV, then the length of the support lines 26 should be at least thirteen feet, six inches. Additionally, the UAV should be a minimum of twenty feet from the highest structure point (which may be a shield or static line) when working on a line. In most cases there is some charge in the shield line which runs above the energized phases, so the UAV should be kept above those.

Importantly, in systems and methods of embodiments of the invention, the power line tool that is suspended from the UAV is lowered onto a power line and/or splice while the UAV hovers safely apart from the power line and preferably outside of the electromagnetic field. The power line tool may comprise any suitable tool for inspecting, repairing, or otherwise performing work on a power line, splice, or other component of a high voltage electrical power system. In the illustrated embodiment, the power line tool comprises a contact inspection tool, such as an OhmStik' from SensorLink Corporation.

The contact inspection tool 30 of embodiments of the invention has a front section 32, a rear section 46, and an elongated middle section 56 therebetween. Each of the front and rear sections 32, 46 have a generally U-shaped portion, the U-shaped portion 34 of the front section 32 being more substantial and forming a gap 36. Each of the front and rear sections 32, 46 have an electrical contact portion 38, 48 (respectively) that contacts the electrical power line 120 and/or the splice 122 when the contact inspection tool 30 is perched on the power line 120 and/or the splice 122. The conventional OhmStik comprises elements 32, 34, 36, 38, 48, and 56 only.

The contact inspection tool 30 of embodiments of the invention typically further comprises a first elongated guide 40 extending substantially vertically downward from a first side of the front section 32, a second elongated guide 42 extending downward and outward from a second side of the front section 32, a first elongated guide 50 extending substantially vertically downward from a first side of the rear section 46, and a second elongated guide 52 extending downward and outward from a second side of the rear section 46. These guides 40, 42, 50, 52 help guide the contact inspection tool 30 into the correct position as the contact inspection tool 30 is lowered onto the power line 120 and/or the splice 122 (i.e., such that the tool 30 rests on the power line 120 and/or the splice 122 with the electrical contact portions 38, 48 in contact with the power line 120 and/or the splice 122). In the embodiment of FIGS. 1-5, the first and second elongated guides of each of the front and rear sections of the contact inspection tool comprise a rigid pole.

In order for the power line tool to perch stably on the power line, the center of gravity of the power line tool must be lower than the power line upon which the power line tool is perched. The weight of the guides 40, 42, 50, 52 helps lower the center of gravity of the tool 30. The guides 40, 42, 50, 52 may be constructed of any suitable material or combination of materials that is sufficiently strong and sufficiently rigid, such as carbon fiber or any suitable polymer. In one exemplary embodiment of the invention, the second guides 42, 52 define hollow cavities into which a ballast material (e.g., sand) may be placed to increase the weight of the second guides 42, 52 as needed to appropriately lower the center of gravity of the tool 30.

As described above, it is preferable that there are at least three support lines between the support frame and the power line too. In the illustrated embodiment, there are two attachment points on the front section 32 of the tool 30 and one attachment point on the rear section 46 of the tool 30. The front two support lines attach to the front section 32 of the tool 30 via a crossbar 60. The crossbar 60 is attached to the front section 32 of the tool 30 via an adapter 62. The adapter 62 may be adjustable to pivot the crossbar 60 forward or rearward as needed. The rear support line attaches to the rear section 46 of the tool 30 via carabiner connector 64. However, the support lines may be attached to the power line tool using any suitable mechanism(s).

Figure 5:
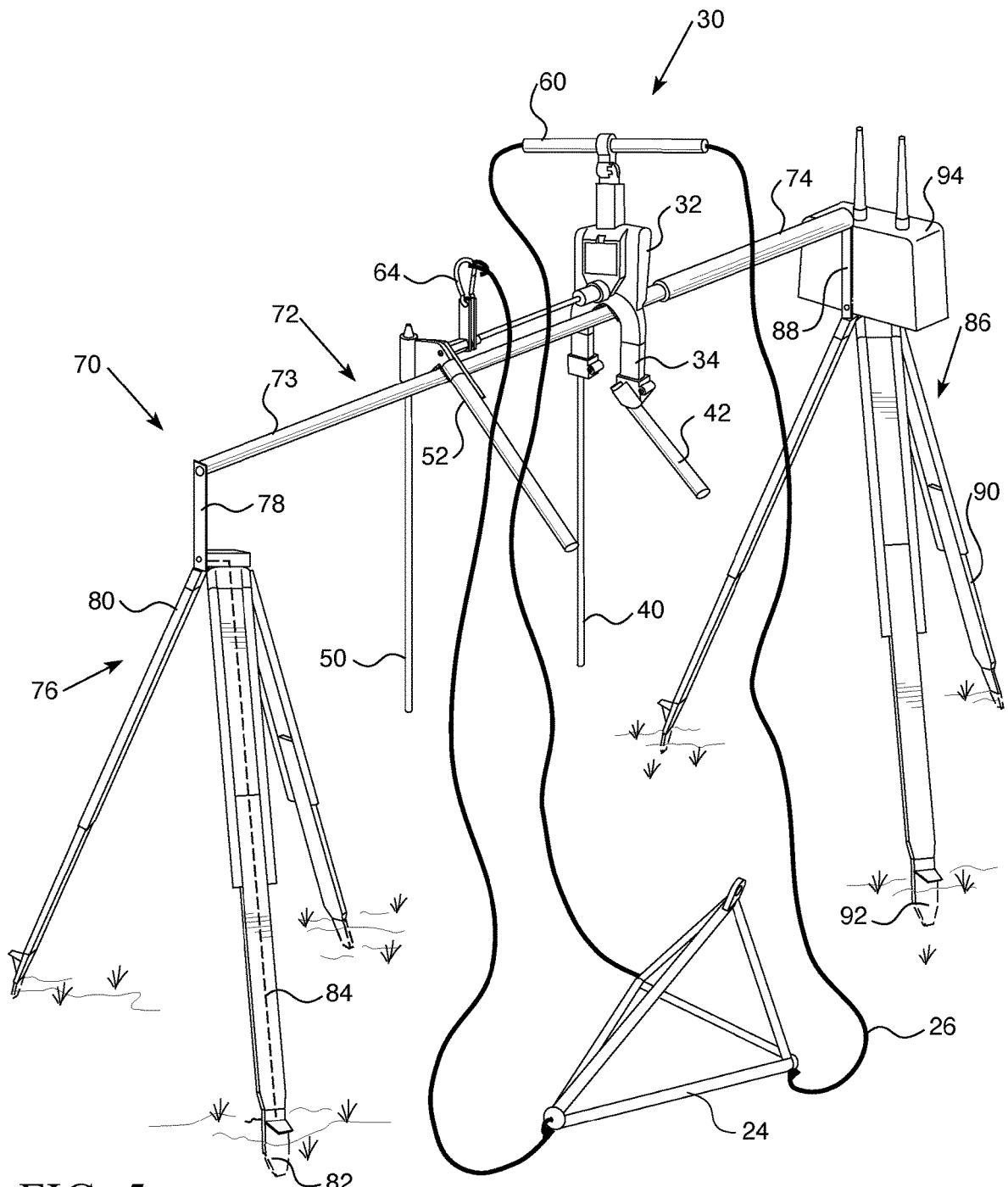
FIG. 5 is a perspective view of the system of FIG. 1, having landed on a perch of embodiments of the invention.

Embodiments of the invention may further include a ground perch 70 (illustrated in FIG. 5). The ground perch is for receiving the power line tool thereupon after completion of a mission (as described further below). In the illustrated embodiment, the ground perch 70 comprises a landing bar 72 supported by opposing upright support structures 76, 86. The landing bar 72 has an electrically conductive portion 73 and may optionally have an electrically non-conductive portion 74. In the illustrated embodiment, the conductive portion 73 is supported by support structure 76 via support bracket 78, and the non-conductive portion 74 is support by support structure 86 via support bracket 88.

The upright support structures 76, 86 will typically comprise a tripod having adjustable legs 80, 90 (respectively) to enable the landing bar 72 to be positioned substantially horizontally even when the ground perch 70 is installed on uneven ground. The legs 80, 90 will typically have feet 82, 92 (respectively) that are shaped to enable the feet 82, 92 to be readily pushed into the ground to limit movement of the support structures 76, 86 and therefore of the ground perch 70.

The electrically conductive portion 73 of the landing bar 72 is electrically connected to a ground wire and/or a ground rod. Because an electrical charge may have built up on the tool 30 during the mission, it is desirable to dissipate this charge at the end of the mission before any person touches the tool 30. When the tool 30 is received upon the electrically conductive portion 73 of the landing bar 72, the electrical charge dissipates through the electrically conductive portion 73 of the landing bar 72 and the ground wire/rod into the ground. In the illustrated embodiment, the ground wire 84 is at least partially contained within one leg 80 of the support structure 76. The ground wire 84 is electrically connected at one end to the support bracket 78 (which is electrically conductive) and at the other end to the foot 82 (which is electrically conductive).

The electrically conductive portion 73 of the landing bar 72, the support bracket 78, and the feet 82 may be constructed out of any suitable material or combination of materials that provides the desired strength, rigidity, and durability and that is electrically conductive, such as any suitable metal or metal alloy. The non-conductive portion 74 of the landing bar 72 may be constructed out of any suitable material or combination of materials that provides the desired strength, rigidity, and durability and that is electrically non-conductive, such as any suitable polymer. In the illustrated embodiment, the feet that do not connect to the ground wire 84 do not need to be constructed out of conductive material but would likely be constructed out of a suitable metal or metal alloy to provide the desired strength, rigidity, and durability. In the illustrated embodiment, the support bracket 86 does not need to be constructed out of conductive material but would likely be constructed out of a suitable metal or metal alloy to provide the desired strength, rigidity, and durability. The legs 80, 90 of the support structures 76, 86 may be constructed out of any suitable material or combination of materials that provides the desired strength, rigidity, and durability. Similar tripods used for surveying often have legs that are constructed of wood.

In alternative embodiments of the invention, the non-conductive portion 74 of the landing bar 72 may be omitted such that the entire landing bar 72 is conductive. In such alternative embodiments, there may also be a path to ground (e.g., ground wire, etc.) in support structure 86.

Due to electromagnetic interference from the power lines, the controller may have difficulty communicating with the UAV. As such, it may be desirable to utilize a conventional ground control station to enhance communications with the UAV. FIG. 5 shows such a ground control station 94 mounted to one of the support structures 86 for convenience. If such a ground control station is mounted to one of the support structures, the ground control station should be mounted to the support structure that is supporting the non-conductive portion of the landing bar. If the landing bar does not include a non-conductive portion, then the ground control station should be mounted in such a way as to ensure that the ground control station is electrically isolated.

Figure 6:
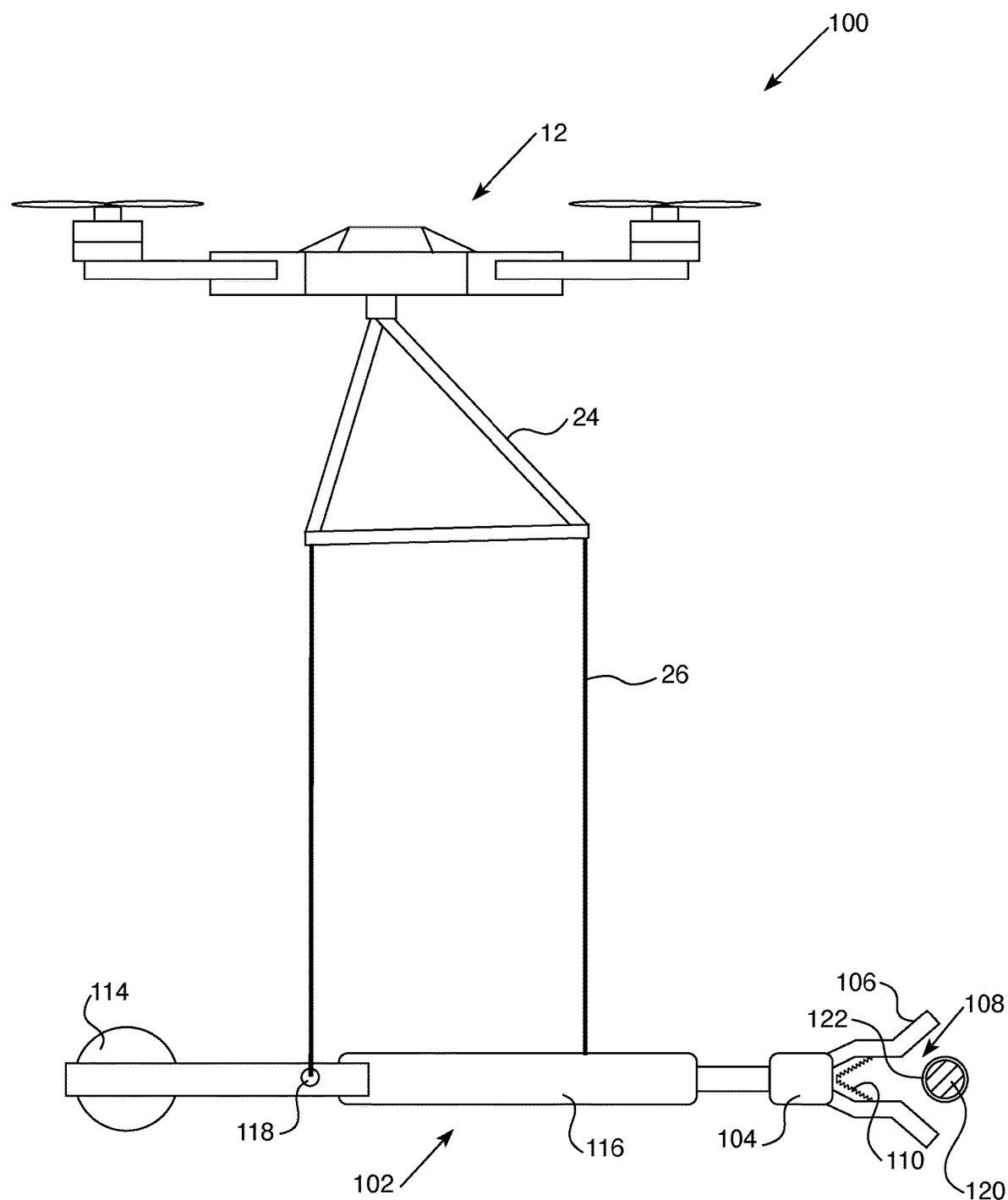
FIG. 6 is a side view of a system for contact inspection of electrical power lines, on approach to a power line, in accordance with alternative embodiments of the invention.

Referring now to FIG. 6, a system 100 for performing work (including contact inspection, repair, or any other suitable work tasks that may be performed) on an electrical power line 120 and/or a splice 122 on the electrical power line 120 is illustrated in accordance with an alternative exemplary embodiment of the invention. The system 100 of FIG. 6 provides for a lateral approach to the power line rather than an approach from above. The system 100 comprises a UAV 12, a support frame 24 selectively releasably attached to the UAV 12, and a plurality of flexible dielectric support lines 26 (although only two are visible in FIG. 6, the system of FIG. 6 includes three support cables) attached to the support frame 24, as in the embodiment of FIGS. 1-5. The system 100 of FIG. 6 includes a tool assembly 102 that is generally horizontal during use. The tool assembly 102 includes an elongated support bar 116. Any suitable tool may be affixed to one end of the support bar 116. In the illustrated embodiment, the tool is similar to tool 30 of the embodiment of FIGS. 1-5 in that the tool has a first end 104 with a generally U-shaped portion 106 forming a gap 108 and having an electrical contact portion 110 (the second end is not visible in FIG. 6). A gyroscopic stabilizing device 114 (similar to those used to stabilize video cameras) is attached to the other end of the support bar 116. The stabilizing device 114 helps limit movement of the tool assembly 102 during use, which helps the pilot initiate and maintain contact between the tool and the power line and/or splice. In an alternative embodiment, a counterweight may be used to stabilize the device instead of such a gyroscopic device to enable the attachment of three cables to the tool assembly 102, a crossbar 118 may extend perpendicularly from the support bar 116 such that two of the support cables can be attached to opposing ends of the crossbar 118.

Figure 7:
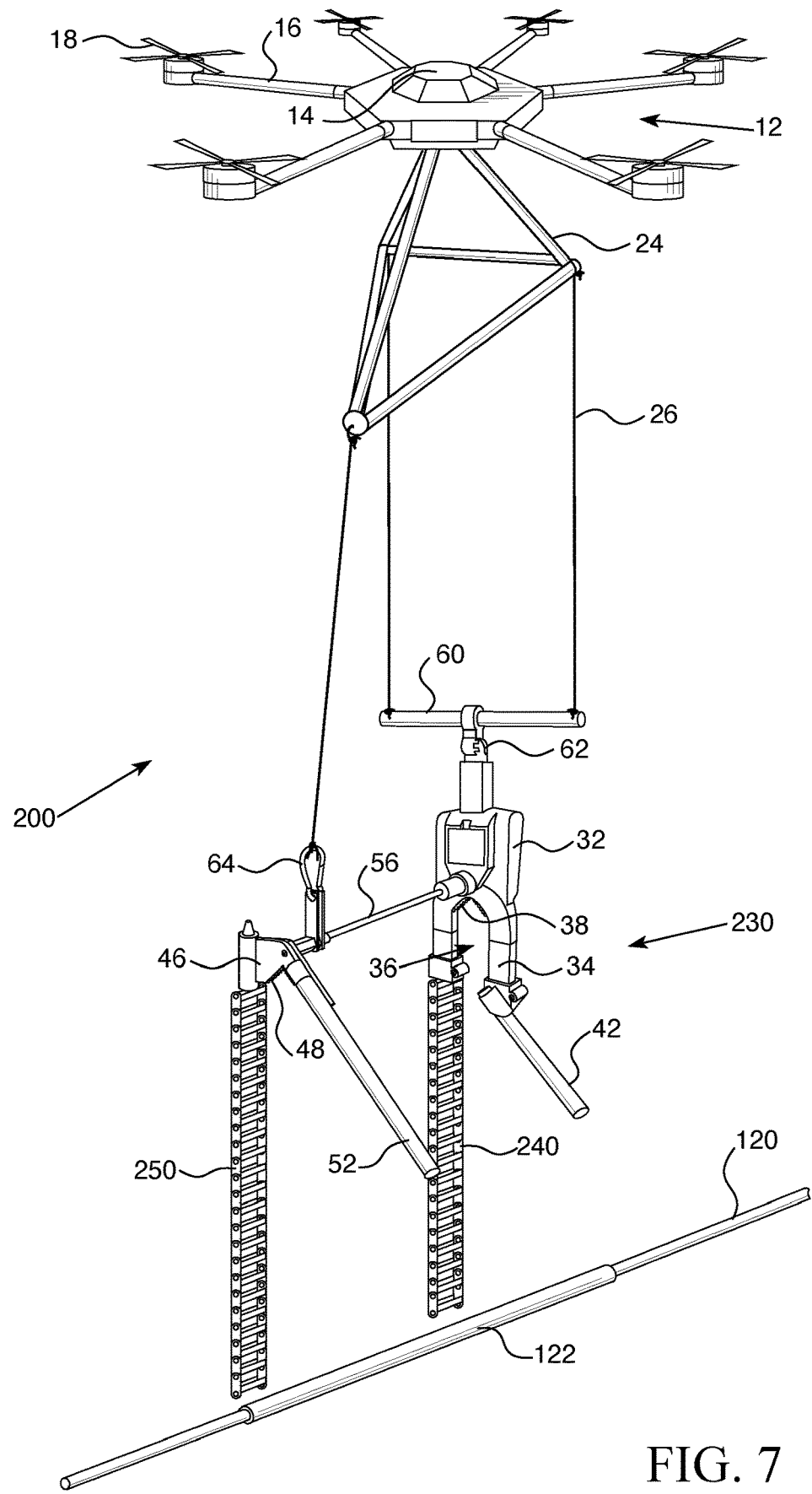
FIG. 7 is a perspective view of a system for contact inspection of electrical power lines, on approach to a power line, in accordance with alternative embodiments of the invention.

Referring now to FIG. 7, a system 200 for performing work (including contact inspection, repair, or any other suitable work tasks that may be performed) on an electrical power line 120 and/or a splice 122 on the electrical power line 120 is illustrated in accordance with an alternative exemplary embodiment of the invention. The system 200 is nearly identical to the system 10 of FIG. 1, except that the elongated guide 240 extending downward from the first side of the front section 32 and the elongated guide 250 extending downward from the first side of the rear section 46 are flexible rather than rigid. In one exemplary embodiment, the elongated guide 240 and the elongated guide 250 comprise a suitable length of Snap-Together Cable and Hose Carrier from McMaster-Carr. Such flexible guides help guide the power line tool 230 onto the power line 120 and/or the splice 122, just as the rigid guides described above do. But the flexible guides perform differently during an emergency release of the power line tool when the power line tool is perched on the line. In such an emergency release, the flexible guides 240, 250 would "snake" off the line as the weight of the support frame pulls the power line tool off the line (whereas the rigid guides swing up into the air gap between lines). This "snaking" feature is especially desirable when the system is working on a power line that is in close proximity to one or more other power lines (such as bundled conductor lines where the lines are typically less than two feet apart.

Embodiments of the invention further comprise methods for using a UAV to deliver and land a tool or similar device on an electrical power line and/or on a splice on an electrical power line, while the UAV maintains flight and does not itself land on the power line and/or splice. Such methods may comprise some or all of the following steps. The airborne portion of the system (such as is illustrated in FIGS. 1-5) is assembled and readied for use, along with a ground perch (such as is illustrated in FIG. 5) if one is to be used. For the airborne portion, a support frame is attached to a UAV via a payload release mechanism, a power line tool is attached to the support frame via a plurality of flexible dielectric support lines, and the power line tool is activated. For the ground perch, the support structures are erected and positioned to support the landing bar in a substantially horizontal position and a height at which there will be sufficient slack in the support lines when the support frame is released from the UAV at the end of the mission so that the power line tool is not pulled off the landing bar. The feet of the support structures (especially the conductive foot to which the ground wire is attached) are pushed down into the ground to stabilize the support structures.

The UAV is piloted to a position adjacent to and higher than the electrical power line and/or the splice on an electrical power line upon which it is desired to perch the power line tool. The UAV is piloted laterally until the first elongated guide of each of the front and rear sections of the power line tool contact the power line and/or the splice. The altitude of the UAV is reduced to lower the power line tool onto the power line and/or the splice such that the power line tool is perched on the power line and/or the splice. The altitude of the UAV is further reduced to introduce slack into the support lines, which helps prevent small in-flight movements of the UAV from pulling the power line tool off the line. The UAV is also moved laterally apart from the power line, as it is not desirable to have the UAV hover directly above the power line while the work is being performed, in case an emergency arises (described further below). While the power line tool is perched on the line and the UAV is hovering near by and laterally apart from the power line, the power line tool performs whatever action (e.g., inspection, repair, etc.) that it is designed to perform. If the power line tool needs to be repositioned on the power line to perform its work, the UAV is piloted appropriated to drag or lift and move the power line tool to a new position to continue/complete the work.

If there is an emergency while the power line tool is perched on the power line, the UAV pilot may activate the payload release mechanism to detach the support frame from the UAV. The support frame will fall to the ground and will pull the power line tool off the line so that the power line tool will also fall to the ground. The combined weight of the support frame and the support lines is selected to be sufficient to pull the power line tool off the power line when the support frame is detached from the UAV.

After the work of the power line tool is completed, the altitude of the UAV is increased to lift the power line tool off of the power line and the UAV is piloted to a position adjacent to and higher than the ground perch. The altitude of the UAV is reduced to lower the power line tool onto the landing bar of the ground perch such that the power line tool is perched on the landing bar of the ground perch. The altitude of the UAV is then further reduced to introduce slack into the support lines and the UAV is piloted laterally apart from the ground perch. The payload release mechanism is activated to detach the support frame from the UAV, and the support frame will fall to the ground adjacent the ground perch. The falling support frame will not pull the power line tool off the ground perch, due to the height of the landing bar being less than the length of the support lines. The UAV may then be landed at a safe distance from the ground perch. Any electrical charge on the power line tool will be dissipated through the ground perch and the power line tool may be removed from the ground perch by a user.

Figure 8:
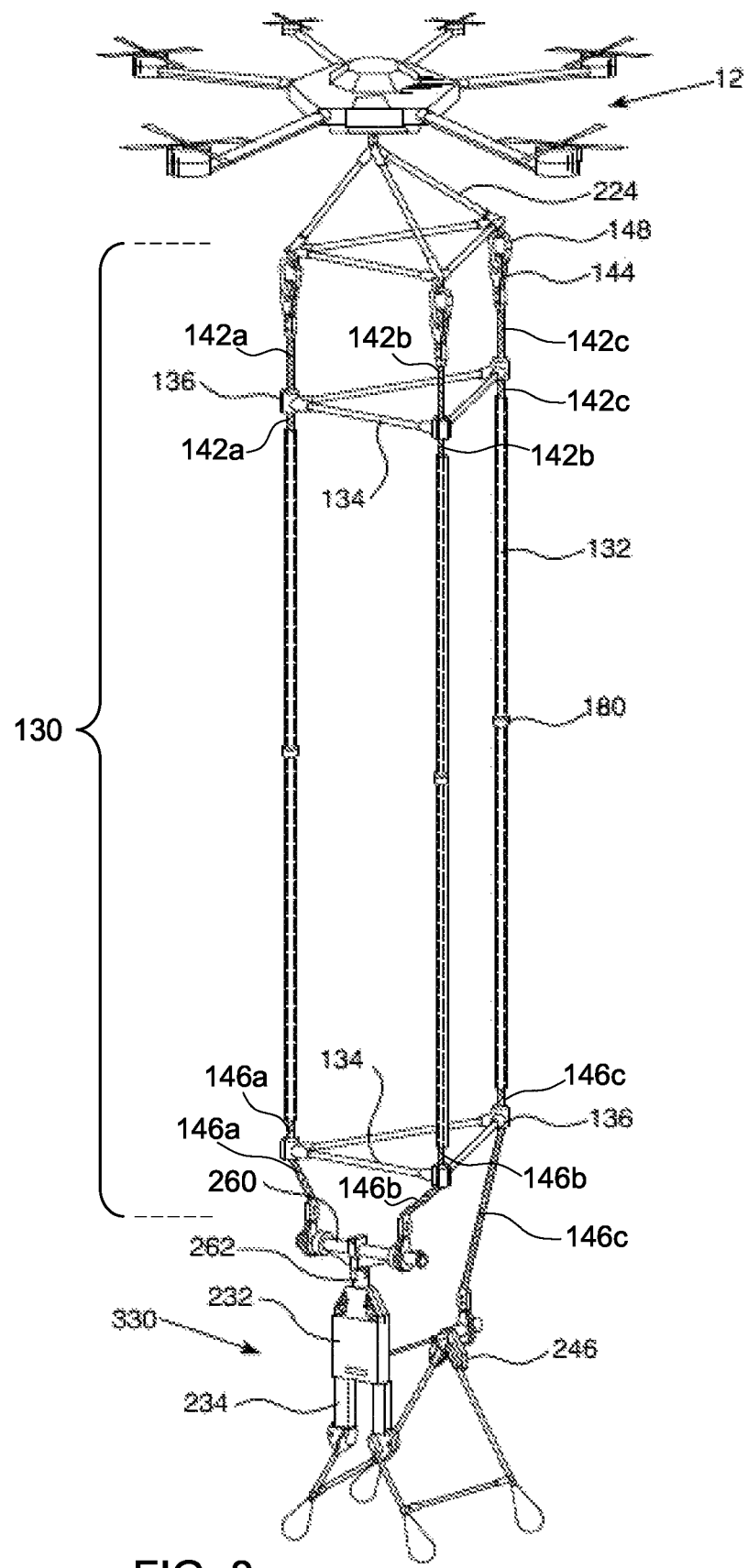
FIG. 8 is a perspective view of a system for contact inspection of electrical power lines, using a payload support frame, in accordance with embodiments of the invention.
Figure 9:
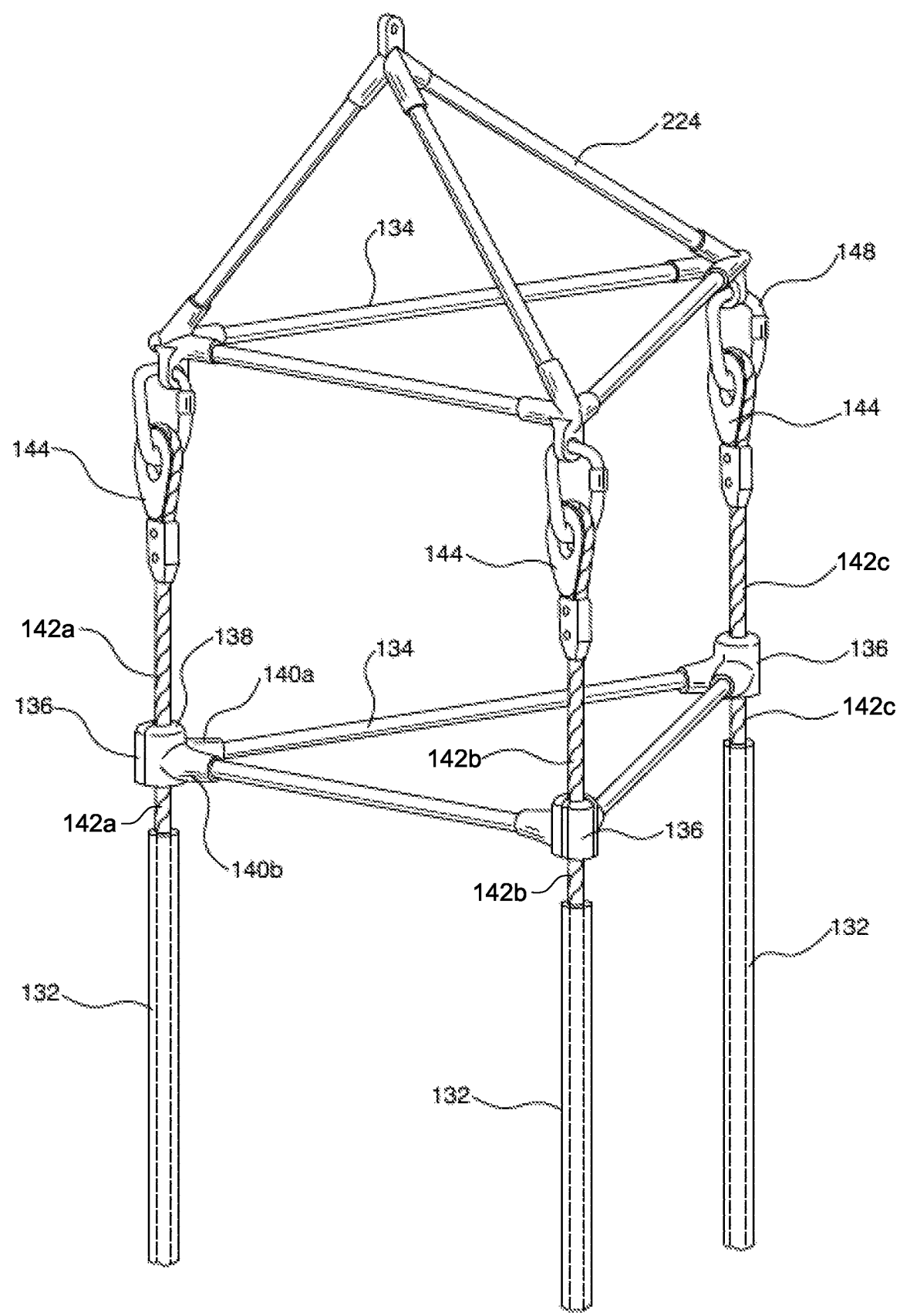
FIG. 9 is a close-up perspective view of the upper end of the payload support frame of FIG. 8.
Figure 10:
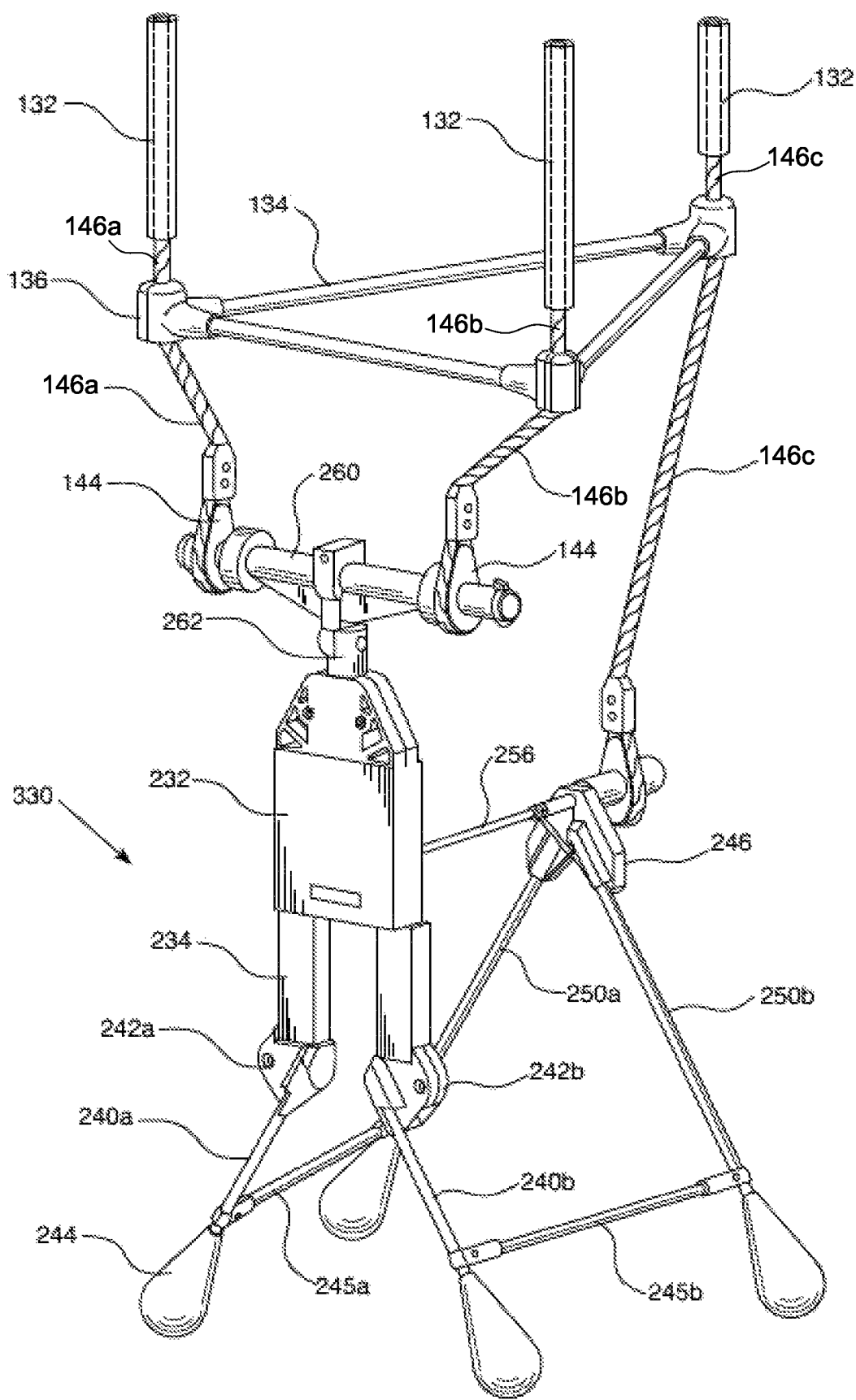
FIG. 10 is a close-up perspective view of the lower end of the payload support frame of FIG. 8.

In the above-described embodiments, flexible dielectric support lines 26 span from the support frame 24 to the tool 30 (or any other suitable tool). Having fully flexible support lines between the support frame and the tool may be problematic in some situations. The fully flexible support lines may allow too much movement of the tool relative to the UAV during flight. Additionally, the fully flexible support lines may snag on the power line after an emergency release of the tool. FIGS. 8-10 illustrate an alternative mechanism for supporting the tool.

FIGS. 8-10 illustrate a semi-rigid payload support frame 130 supported in flight by a UAV 12 via an intermediary support frame 224. (The payload support frame 130 may be termed a "lower support frame" while the support frame 224 may be termed an upper support frame. The support frame 224 of FIGS. 8-10 is very similar to the support frame 24 of FIGS. 1-7. The main difference between the support frame 224 of FIGS. 8-10 and the support frame 24 of FIGS. 1-7 is that the support frame 224 has mounting holes (not labeled) at each lower corner to accept a carabiner 148 for selectively attaching the payload support frame 130 to the support frame 224.) The payload support frame 130 comprises a plurality of elongated rigid vertical poles 132 (as seen in FIG. 8, the poles 132 of the payload support frame 130 are substantially vertical when attached to a UAV in flight), a plurality of horizontal poles 134 at both the upper and lower ends of the poles 132, and a plurality of joints 136 connecting the vertical poles 132 and the horizontal poles 134 at both the upper and lower ends of the poles 132. In the illustrated embodiment, there are three vertical poles 132 and six horizontal poles 134 (three at each end of the vertical poles 132), such that the horizontal poles 134 at each end form a triangle and the overall shape of the payload support frame 130 is a triangular prism (although the prism shape is not completely rigid, as described below). In the illustrated embodiment, two of the horizontal poles 134 in each of the opposite end groupings are equal length and the third is a different length than the other two, such that the horizontal poles at each end form an isosceles triangle. In alternative embodiments of the invention, the horizontal poles are equal length such that the horizontal poles at each end form an equilateral triangle. Alternative embodiments of the invention may comprise four vertical poles and eight horizontal poles (four at each end) such that the horizontal poles at each end form a rectangle and the overall shape of the payload support frame is a rectangular prism.

There are three joints 136 at each end of the payload support frame 130. As best seen in FIGS. 9 and 10, each joint 136 comprises a vertical tube 138 that is open at both ends and two horizontal tubes 140*a*, 140*b* projecting perpendicularly from the side of the vertical tube 138 and having open distal ends. Each horizontal tube 140*a*, 140*b* receives an end of a corresponding one of the horizontal poles 134, which is secured together using any suitable mechanism or method, to hold the horizontal poles 134 in the triangular arrangement. Each end of the horizontal poles 134 is secured in the corresponding horizontal tube 140*a*, 140*b*, such that the triangular shapes are rigidly maintained. The angle between the horizontal tubes 140a, 140b of each joint 136 establishes the angles of the triangles formed by the horizontal poles 134.

The payload support frame 130 further comprises a plurality of upper flexible dielectric support lines 142a-c, a plurality of lower flexible dielectric support lines 146a-c, where one upper support line 142 and one lower support line 146 correspond to a vertical pole 132. Each end of each upper support line 142 has any suitable attachment mechanism 144 for attaching one end of each line to a UAV (such as via a frame 224) and the other end to a tool. In the illustrated embodiment, each end of each upper support line 142 has a loop formed in a conventional manner using a thimble and a rope clamp (not labeled). The thimbles each have a hole for receiving a carabiner 148 at the upper end and a portion of the power line tool 330 at the lower end. In one embodiment of the invention, each upper support line 142 runs through the vertical tube 138 of a corresponding joint 136 at one end of the payload support frame 130, through a corresponding one of the vertical poles 132, and through the vertical tube 138 of a corresponding joint 136 at the opposite end of the payload support frame 130. A suitable length (about 18 inches in the illustrated embodiment) of each upper support line 142 extends beyond the corresponding end of the payload support frame 130. Importantly, each end of each vertical pole 132 is not rigidly affixed to its corresponding joint 136. Rather, the support lines 142a-c running between each joint 136 and each corresponding vertical pole 132 (best seen in FIGS. 9 and 10) provides a flexible connection between each end of each vertical pole 132 and the corresponding joint 136. In the illustrated embodiment, each vertical pole comprises two telescoping sections to reduce (by nearly half) the length of the payload support frame 130 for easy transport and storage of the device. A flip-lock collar 180 or the like locks to hold the two sections in relative position and unlocks to enable the two sections to telescope together for storage or apart for use.

Any suitable mechanism or method may be used to secure each support line 142 to each corresponding joint 136 such that the upper support line 142 does not slide within the vertical tube 138 of its corresponding joints 136. In one exemplary embodiment, a booster clamp is secured to each support line and then glued to the corresponding joint.

In a preferred embodiment, each lower support line 146a-c is continuous from the attachment mechanism 144 at one end to the attachment mechanism 144 at the opposing end. In an alternative embodiment (not illustrated), each upper support line 142 and each lower support line 146 comprises two discontinuous support line segments. Each support line segment spans from an attachment mechanism at one end, through a corresponding joint 136, and partway (e.g., about 6-12 inches) into a corresponding end of a corresponding vertical pole 132. The end of each support line segment within the vertical pole (which may be termed "internal ends") must be secured to the vertical pole using any suitable mechanism or method. Thus, there is a gap between the internal ends of corresponding support line segments within a corresponding vertical pole. Such a gap reduces the length of support line material needed and may therefore reduce the total cost and, importantly, the total weight of the payload support frame.

The semi-rigid payload support frame of embodiments of the invention provides a mechanism for supporting a payload from a UAV or other aerial platform, with reduced motion and increased stability as compared to using only flexible support lines as described above and shown in FIGS. 1-7. The semi-rigid payload support frame of embodiments of the invention is also less likely to snag on the power line after an emergency release of the tool. The semi-rigid payload support frame of embodiments of the invention can collapse for easier transport. The semi-rigid payload support frame of embodiments of the invention allows some twisting movement, but the twisting movement is limited as compared to using only flexible support lines.

As with the flexible support lines as described above and shown in FIGS. 1-7, the length of the payload support frame of embodiments of the invention is selected to maintain a sufficient distance between the UAV and the power line to prevent damage to the UAV from the electromagnetic fields surrounding such high-voltage power lines. In the illustrated embodiment of FIGS. 8-10, the vertical poles are about 12 feet long (when extended) and the overall length of the payload support frame (from the attachment mechanisms 144 on one end to the attachment mechanisms 144 on the opposing end) is about 15 feet long. The length of the vertical poles may be selected to provide the desired distance between the UAV and the power line. In another embodiment for lower voltage power lines for which a smaller distance between the UAV and the power line is needed, the vertical poles are about 6 feet long (when extended) and the overall length of the payload support frame (from the attachment mechanisms on one end to the attachment mechanisms on the opposing end) is about 9 feet long.

The payload support frame of embodiments of the invention may be used to support and carry any suitable tool. In the embodiment of FIGS. 8-10, the payload support frame 130 carries a contact inspection tool 330. The contact inspection tool 330 is and functions very similar to the contact inspection tool 30 of FIGS. 1-6 and has a front section 232, a rear section 246, and an elongated middle section 256 therebetween. The front section 232 has a generally U-shaped portion 234. A crossbar 260 is attached to the front section 232 via a connector 262. The contact inspection tool 330 further comprises first and second elongated front guides 240a, 240b attached to the U-shaped portion 234 of the front section 232 via connectors 242a, 242b and extending downward and outward therefrom. The contact inspection tool 330 further comprises first and second elongated rear guides 250a, 250b extending downward and outward from the rear section 246. First and second reinforcing bars 245a, 245b extend, respectively, from the first elongated front guide 240a to the first elongated rear guide 250a and from the second elongated front guide 240b to the second elongated rear guide 250b to add rigidity to the tool. Teardrop-shaped weights 244 are affixed to the distal ends of the first and second elongated front guides 240a, 240b and the first and second elongated rear guides 250a, 250b to improve stability. The guides 240a, 240b, 250a, 250b help guide the contact inspection tool 330 into the correct position as the contact inspection tool 330 is lowered onto the power line 120 and/or the splice 122 (i.e., such that the tool 330 rests on the power line 120 and/or the splice 122 with the electrical contact portions (not visible) in contact with the power line 120 and/or the splice 122).

As seen in FIGS. 8 and 10, the contact inspection tool 330 is supported by the payload support frame 130 by attaching two of the lower support lines 146a and 146b to opposite ends of the crossbar 260 and the lower support line 146c to a distal end of the elongated middle section 256.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

That which is claimed:

1. A payload support frame adapted to suspend a payload from an unmanned aerial vehicle (UAV) during flight, the frame comprising:
    at least one elongated rigid segment;
    at least one upper flexible segment at an upper end of the rigid segment; and
    at least one lower flexible segment at a lower end of the rigid segment;
    wherein one or more of (a) the at least one rigid segment, (b) the at least one upper flexible segment, or (c) the at least one lower flexible segment comprise a dielectric material;
    wherein the at least one upper flexible segment is adapted to be selectively attachable, directly or indirectly, to the UAV; and
    wherein the at least one lower flexible segment is adapted to be selectively attachable, directly or indirectly, to the payload.

2. The frame of claim 1, wherein the at least one rigid segment comprises at least three rigid segments;
    wherein the at least one upper flexible segment comprises at least three upper flexible segments, each at an upper end of a corresponding rigid segment; and
    wherein the at least one lower flexible segment comprises at least three lower flexible segments, each at a lower end of a corresponding rigid segment.

3. The frame of claim 2, wherein each of the at least three rigid segments comprise an elongated pole;
    wherein each of the at least three upper flexible segments comprises a rope, cable, or wire; and
    wherein each of the at least three lower flexible segments comprises a rope, cable, or wire.

4. The frame of claim 3, wherein each of the elongated poles is hollow.

5. The frame of claim 4, wherein each of the at least three upper flexible segments and corresponding ones of each of the at least three lower flexible segments each comprise a single rope, cable, or wire extending through a corresponding one of the elongated poles.

6. The frame of claim 4, wherein the elongated poles each comprise two or more telescoping pole segments.

7. The frame of claim 3, further comprising a rigid upper spacer frame configured to hold the at least three upper flexible segments, and thereby the upper ends of the corresponding rigid segments, in a spaced-apart arrangement.

8. The frame of claim 7, further comprising a rigid lower spacer frame configured to hold the at least three lower flexible segments, and thereby the lower ends of the corresponding rigid segments, in a spaced-apart arrangement.

9. The frame of claim 8, wherein the at least three upper flexible segments comprise at least three first upper flexible segments;
    wherein the at least three lower flexible segments comprise at least three first lower flexible segments; and
    wherein the frame further comprises:
        at least three second upper flexible segments, each of the at least three second upper flexible segments on an opposite side of the upper spacer frame from a corresponding one of the at least three first upper flexible segments; and
        at least three second lower flexible segments, each of the at least three second lower flexible segments on an opposite side of the lower spacer frame from a corresponding one of the at least three first lower flexible segments;
    wherein each of the at least three second upper flexible segments and a corresponding one of the at least three first upper flexible segments comprise a single rope, cable, or wire extending through a corresponding channel in the rigid upper spacer frame; and
    wherein each of the at least three second lower flexible segments and a corresponding one of the at least three first lower flexible segments comprise a single rope, cable, or wire extending through a corresponding channel in the rigid lower spacer frame.

10. A payload support frame adapted to suspend a payload from an unmanned aerial vehicle (UAV) during flight, the frame comprising:
    at least three elongated rigid segments, each comprising a hollow elongated pole;
    at least three upper flexible segments, each at an upper end of a corresponding rigid segment and each comprising a rope, cable, or wire;
    at least three lower flexible segments, each at a lower end of a corresponding rigid segment and each comprising a rope, cable, or wire;
    a rigid upper spacer frame configured to hold the at least three upper flexible segments, and thereby the upper ends of the corresponding rigid segments, in a spaced-apart arrangement, the rigid upper spacer frame being in a spaced-apart arrangement from the upper ends of the at least three rigid segments; and
    a rigid lower spacer frame configured to hold the at least three lower flexible segments, and thereby the lower ends of the corresponding rigid segments, in a spaced-apart arrangement; the rigid lower spacer frame being in a spaced-apart arrangement from the lower ends of the at least three rigid segments;
    wherein the at least three upper flexible segments and the at least three lower flexible segments all comprise a dielectric material;
    wherein the at least three upper flexible segments are adapted to be selectively attachable, directly or indirectly, to the UAV; and
    wherein the at least three lower flexible segments are adapted to be selectively attachable, directly or indirectly, to the payload.

11. The frame of claim 10, wherein each of the at least three upper flexible segments and corresponding ones of each of the at least three lower flexible segments each comprise a single rope, cable, or wire extending through a corresponding one of the elongated poles.

12. The frame of claim 10, wherein the elongated poles each comprise two or more telescoping pole segments.

\* \* \* \* \*